Figure 1A:
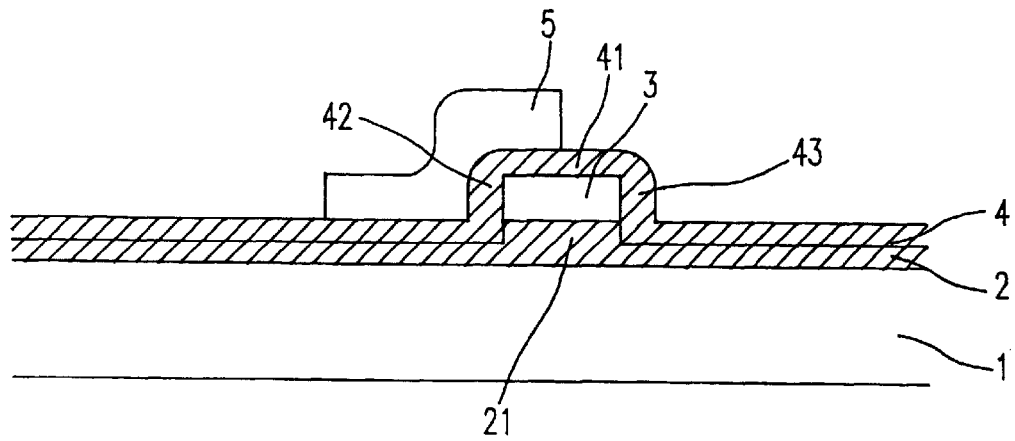

United States Patent
Sung

[11] Patent Number: 6,083,792
[45] Date of Patent: Jul. 4, 2000

[54] MANUFACTURING PROCESS OF A SPLIT GATE FLASH MEMORY UNIT

[75] Inventor: Kuo-Tung Sung, Hsinchu, Taiwan

[73] Assignee: Mosel Vitelic, Inc., Hsinchu, Taiwan

[21] Appl. No.: 08/774,753

[22] Filed: Dec. 30, 1996

[30] Foreign Application Priority Data

Nov. 11, 1996 [TW] Taiwan .................................. 85113794

[51] Int. Cl.[7] .............................................. H01L 21/8247
[52] U.S. Cl. ............................ 438/264; 438/266; 438/591
[58] Field of Search ...................................... 438/264, 265, 438/266, 267, 591, 593, 594, 595

[56] References Cited

U.S. PATENT DOCUMENTS

| | | | |
|---|---|---|---|
| 5,153,143 | 10/1992 | Schlais et al. ........................... | 438/266 |
| 5,395,778 | 3/1995 | Walker .................................... | 438/265 |
| 5,585,293 | 12/1996 | Sharma et al. .......................... | 438/264 |

OTHER PUBLICATIONS

Wolf, "Silicon Processing for the VLSI Era", vol. 1: Process Technology; pp. 182–184, 1990.

"Improved Performance and Reliability of Split Gate Source–Side Injected Flash Memory Cells", by Surya Bhattacharya et al., from IEDM 96' p. 339.

*Primary Examiner*—Chandra Chaudhari
*Attorney, Agent, or Firm*—Laff, Whitesel & Saret, Ltd

[57] ABSTRACT

A manufacturing process of a split gate flash memory unit is disclosed. The manufacturing process includes: (a) providing a silicon substrate having a first insulating layer, and forming a first conductive layer on said first insulating layer; (b) removing part of the first conductive layer to expose left and right sidewalls of said first conductive layer and part of the first insulating layer; (c) forming a second insulating layer on left and right sidewalls of said first conductive layer; (d) performing an oxidation process to form a third insulating layer on said first conductive layer, said second insulating layer, and said other part area of said first insulating layer, wherein by an isolation effect provided by said second insulating layer a leaking phenomenon at left and right lower edges of said first conductive layer is reduced; and (e) forming a second conductive layer on said third insulating layer to form said split gate flash memory unit.

13 Claims, 5 Drawing Sheets

MANUFACTURING PROCESS OF A SPLIT GATE FLASH MEMORY UNIT

FIELD OF THE INVENTION

The present invention relates to the structure and manufacturing process of a split gate flash memory unit.

DESCRIPTION OF THE PRIOR ART

The well known types in read only memory family include Erasable Programmable ROM (EPROM), Electrically Erasable Programmable ROM ($E^2$PROM), Flash ROM, etc., wherein the gate structure of $E^2$PROM or Flash ROM includes a floating gate and a control gate just as those of EPROM, but due to that $E^2$PROM and Flash ROM need not to use ultra-violet light during data clearing, these two structures are therefore better than EPROM in terms of data clearing.

Furthermore, since both $E^2$PROM and Flash ROM utilize hot carriers for tunnelling a thin layer of $SiO_2$ underlying the floating gate to enter the floating gate, or by applying a high voltage across the tunnel oxide, and the hot carriers trapping within the floating gate can tunnel through said thin layer of $SiO_2$ so as to achieve the data writing and clearing. However, the structure of conventional $E^2$PROM or Flash ROM has the problem of over-erasing. In order to solve the disadvantage of over-erasing, a split gate flash memory unit becomes the major structure in current $E^2$PROM and Flash ROM.

Figure 1B:
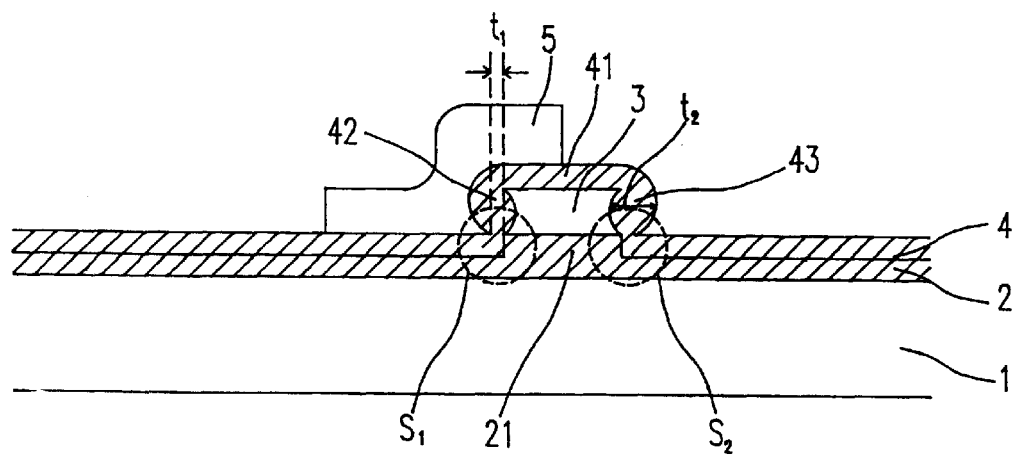

Please refer to FIG. 1(a) and 1(b), which are the schematic ideal and practical structure diagrams of conventional split gate flash memory unit respectively. The structure in FIG. 1(a) includes a silicon substrate 1, a first insulating layer 2, a floating gate 3, a second insulating layer 4, and a control gate 5. Said first insulating layer 2 is an oxide layer, and said second insulating layer 4 is composed of an insulating layer 41 between polysilicons and oxides layers 42, 43 on left and right side walls. Said insulating layer 41 and said oxide layers 42, 43 have considerable thickness so as to provide a well blocking effect between said floating gate 3 and said control gate 5. In addition, if said first insulating layer 2 is a gate oxide layer, then said second insulating layer 4 is a tunnelling oxide layer; in contrary, if said first insulating layer 2 is a tunnelling oxide layer, then said second insulating layer 4 is a gate oxide layer.

However, practically the real situation is not so perfect as shown in FIG. 1(a). Please refer to FIG. 1(b), which is the schematic practical structure diagram of conventional split gate flash memory unit. As shown in FIG. 1(b), there also includes a silicon substrate 1, a first insulating layer 2, a floating gate 3, a second insulating layer 4, and a control gate 5. Said first insulating layer 2 is an oxide layer, and said second insulating layer 4 is composed of an insulating layer 41 between polysilicons and oxide layers 42, 43 on left and right side walls.

When said second insulating layer 4 is to be formed on the first insulating layer 2, since said floating gate 3 can be a polysilicon layer or a polycide layer, the oxidation rate around said floating gate 3 is higher than that on the first insulating layer 2 (usually 1.6 to 1.7 times higher or even more), so the thickness of oxide layers 42, 43 is thicker in the middle (t2) of left and right side walls than that at the lower edges (t1). Therefore, said oxide layers 42, 43 can not provide a well blocking effect at left and right lower edges of said floating gate 3. Besides, the control gate 5 will form a sharp tip along left and right lower edges of said side walls, which will cause serious problems in charge retention and program disturbing characteristics.

Consequently, once said control gate 5 is formed on said insulating layer 41 and oxide layers 42, 43, the charges stored in said control gate 5 and said floating gate 3 have the tendency to cause a leaking phenomenon through the thin oxide areas shown as S1, S2 in FIG. 1(b), so that the charge retention property of conventional split gate flash memory is not good enough. Furthermore, the object of a complete isolation status between said floating gate 3 and said control gate 5 can not be achieved, and the reliability of conventional split gate flash memory unit is reduced.

Figure 2A:
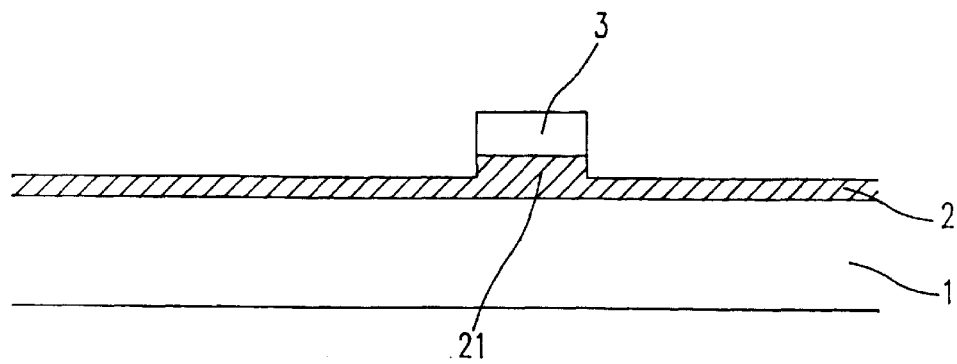
Figure 2B:
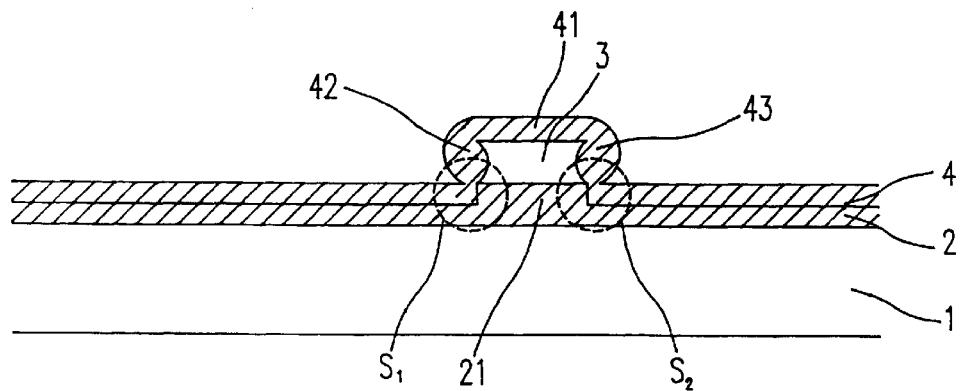
Figure 2C:
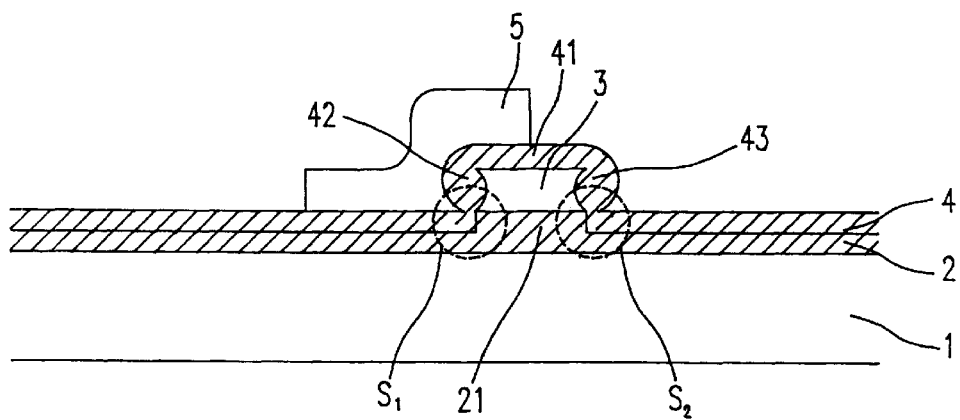

In order to further describe the manufacturing process of conventional split gate flash memory unit, please refer to FIG. 2(a)~(c), wherein:

FIG. 2(a) includes the following steps:
  forming a first insulating layer 2 on said silicon substrate 1;
  forming a polysilicon layer (or a polycide layer) on said first insulating layer 2; and
  removing part of said polysilicon layer by photolithography and etching techniques, the polysilicon layer that remains being used as a floating gate 3.

FIG. 2(b) includes the following steps:
  performing a thermal oxidation process to form an insulating layer 41 on top surface of said floating gate 3, and form said oxide layers 42, 43 on left and right sidewalls of said floating gates 3; wherein both said oxide layer 42, 43 and said insulating layer 41 are used as an isolation layer.

Since the oxidation rate around said floating gate 3 is higher than that between insulating layers 2, 4, the oxide layers 42, 43 will be thicker in the middle (with thickness t2) than at the lower edges between the insulating layers 2, 4 (with thickness t1) as shown in FIG. 1(b), that is to say, thin oxide areas S1, S2 will be formed at left and right lower edges of said floating gate 3.

FIG. 2(c) includes the following steps:
  forming another polysilicon layer on said insulating layer 41 and said oxide layers 42, 43 of said left and right sidewalls; and
  removing part of said another polysilicon layer by photolithography and etching techniques, the polysilicon that remains being used as a control gate 5.

As mentioned above, the charges in said floating gate 3 and said control gate 5 has the tendency to form a "leaking" phenomenon through said thin oxide area S1, S2, and causes that the split gate flash memory unit can not maintain an excellent charge retention property.

In brief, it is indeed that a bad isolation disadvantage exists between said floating gate 3 and said control gate 5 in conventional split gate flash memory unit. If a structure and a process can be provided to reduce or eliminate said leaking phenomenon, then apparently the charge retention property of the split gate flash memory unit will be improved. The present invention is directed toward this object.

SUMMARY OF THE INVENTION

The major object of the present invention is to provide a structure of split gate flash memory unit to avoid the leaking phenomenon.

Another object of the present invention is to provide a manufacturing process of split gate flash memory unit to avoid the leaking phenomenon.

The present invention relates to the structure of a split gate flash memory unit, which comprises a silicon substrate; a first insulating layer formed on said silicon substrate; a first conductive layer formed on part area of said first insulating layer; a second insulating layer formed on left and right sidewalls of said first conductive layer and providing a well blocking effect to reduce the leaking phenomenon at left and right lower edges of said first conductive layer; a third insulating layer formed on said first conductive layer, said second insulating layer and other part area of said first insulating layer; and a second conductive layer formed on said third insulating layers to isolate with said first conductive layer by the blocking function of said second and third insulating layer.

According to ideas above, wherein said first insulating layer can be a gate oxide layer.

According to ideas above, wherein the thickness of said gate oxide layer is at least 60 Å.

According to ideas above, wherein said third insulating layer can be a tunnelling oxide layer.

According to ideas above, wherein said tunnelling oxide layer can be a $SiO_2$ layer.

According to ideas above, wherein the thickness of said tunnelling oxide is 60 Å~120 Å.

According to ideas above, wherein said first insulating layer can be a tunnelling oxide layer.

According to ideas above, wherein said tunnelling oxide layer can be a $SiO_2$ layer.

According to ideas above, wherein the thickness of said tunnelling oxide layer is 60 Å~120 Å.

According to ideas above, wherein said third insulating layer can be a gate oxide layer.

According to ideas above, wherein the thickness of said gate oxide layer is at least 60 Å.

According to ideas above, wherein said first conductive layer can be a polysilicon layer.

According to ideas above, wherein said first conductive layer can be a polycide layer.

According to ideas above, wherein the thicknesss of said second insulating layer can be 50 Å~5000 Å.

According to ideas above, wherein said second insulating layer can be a dielectric layer.

According to ideas above, wherein said second insulating layer can be a spacer layer.

According to ideas above, wherein said second conductive layer can be a polysilicon layer.

The present invention also relates to the manufacturing process of a split gate flash memory unit, which comprises the steps of: (a) providing a silicon substrate having a first insulating layer, and forming a first conductive layer on said first insulating layer; (b) removing part of the first conductive layer to expose left and right sidewalls of said first conductive layer and part of the first insulating layer; (c) forming a second insulating layer on left and right sidewalls of said first conductive layer; (d) performing an oxidation process to form a third insulating layer on said first conductive layer, said second insulating layer, and said other part area of said first insulating layer, wherein by an isolation effect provided by said second insulating layer a leaking phenomenon at left and right lower edges of said first conductive layer is reduced; and (e) forming a second conductive layer on said third insulating layer to form said split gate flash memory unit.

According to ideas above, wherein said step (a) includes the steps of: (a1) forming an oxide layer on said silicon substrate; (a2) forming a first conductive layer on said oxide layer.

According to ideas above, wherein said oxide layer in step (a1) can be a gate oxide layer.

According to ideas above, wherein the thickness of said gate oxide layer is at least 60 Å.

According to ideas above, wherein the process in forming said gate oxide layer can be a thermal oxidation process.

According to ideas above, wherein said oxide layer in step (a1) can be a tunnelling oxide layer.

According to ideas above, wherein said tunnelling oxide layer can be a $SiO_2$ layer.

According to ideas above, wherein the thickness of said tunnelling oxide layer is 60 Å~120 Å.

According to ideas above, wherein the process in forming said tunnelling oxide layer can be a chemical vapor deposition (CVD) process.

According to ideas above, wherein the process in forming said tunnelling oxide layer can be a thermal oxidation process.

According to ideas above, wherein said first conductive layer in said step (a2) can be a polysilicon layer.

According to ideas above, wherein said first conductive layer in said step (a2) can be a polycide layer.

According to ideas above, wherein the process in step (a2) to form said first conductive layer can be a chemical vapor deposition (CVD) process.

According to ideas above, wherein said step (b) includes the steps of: (b1) forming a photoresist layer on said first conductive layer; and (b2) etching part of said first conductive layer by photolithography and etching techniques to expose left and right sidewalls of said first conductive layer as well as part of the first insulating layer.

According to ideas above, wherein removing part of said first conductive layer in step (b) can be done by a dry etching process.

According to ideas above, wherein said step (c) includes steps of: (c1) forming a dielectric layer on said first conductive layer and its left and right sidewalls as well as part area of the first insulating layer; and (c2) removing part of the dielectric layer to expose the top surface of said first conductive layer and part area of said first insulating layer, so that a second insulating layer is formed on left and right sidewalls of said first conductive layer.

According to ideas above, wherein the process in step (c1) to form said dielectric layer can be done by a chemical vapor deposition (CVD) process.

According to ideas above, wherein the process in step (c2) to form said dielectric layer can be done by an anisotropic etching process.

According to ideas above, wherein the thickness of said second insulating layer in step (c2) can be 50~5000 Å.

According to ideas above, wherein the process in step (d) can be a thermal oxidation process.

According to ideas above, wherein said third insulating layer in step (d) can be a tunnelling oxide layer.

According to ideas above, wherein said tunnelling oxide can be a $SiO_2$ layer.

According to ideas above, wherein the thickness of said tunnelling oxide layer is 60 Å~120 Å.

According to ideas above, wherein the process in forming said tunnelling oxide layer can be done by a chemical vapor deposition process.

According to ideas above, wherein the process in forming said tunnelling oxide layer can be done by a thermal oxidation process.

According to ideas above, wherein said third insulating layer in said step (d) can be a gate oxide layer.

According to ideas above, wherein the thickness of said gate oxide layer is at least 60 Å.

According to ideas above, wherein the process in forming said gate oxide layer can be done by a thermal oxidation process.

According to ideas above, wherein said step (e) includes the steps of:

(e1) forming said second conductive layer on said third insulating layer;

(e2) forming a photoresist layer on said second conductive layer; and (e3) etching part of said second conductive layer by photolithography and etching techniques to form a split gate flash memory unit.

According to ideas above, wherein said second conductive layer in step (e) can be a polysilicon layer.

According to ideas above, wherein the process in step (e) to form said second conductive layer can be done by a chemical vapor deposition process.

BRIEF DESCRIPTIONS OF THE DRAWINGS

Figure 3:
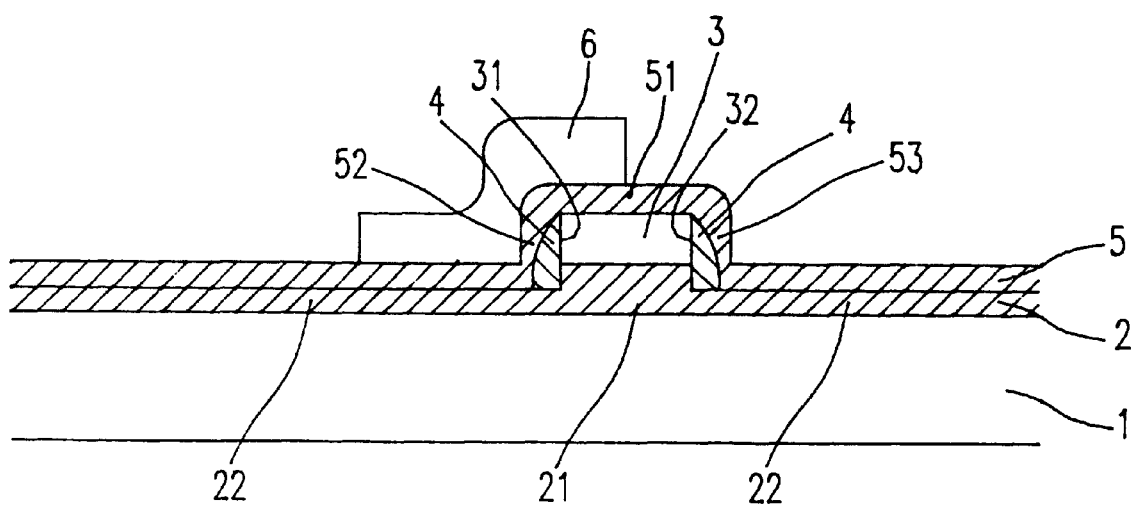

The present invention can be better understood by the following drawings and the detailed descriptions, in which:

FIGS. 1(a) and 1(b) are ideal and practical schematic structure diagrams of conventional split gate flash memory unit respectively;

FIGS. 2(a)~2(c) are the manufacturing processes of conventional split gate flash memory unit;

FIG. 3 is the schematic structure diagram of a preferred embodiment of the present invention;

FIGS. 4(a)~4(d) are the manufacturing processes of a preferred embodiment of the present invention;

PREFERRED EMBODIMENTS OF THE PRESENT INVENTION

Please refer to FIG. 3, which is the schematic structure diagram of a preferred embodiment of the present invention, and comprises a silicon substrate 1, a first insulating layer 2, a first conductive layer 3, a second insulating layer 4, a third insulating layer 5, and a second conductive layer 6; wherein said third insulating layer 5 comprises an insulating layer 51 between polysilicons and oxide layers 52, 53 on left and right sidewalls.

Preferably, said first insulating layer 2 is a gate oxide layer with the thickness of at least 60 Å, and said third insulating layer 5 is a tunnelling oxide layer; wherein said tunnelling oxide layer is a $SiO_2$ layer with the thickness of 60~120 Å. Of course, said first insulating layer 2 can be a tunnelling oxide, and said third insulating layer 5 will then be a gate oxide layer.

Moreover, said first conductive layer 3 can be a polysilicon layer or a polycide layer, and said second conductive layer 6 can be a polysilicon layer. In addition, said second insulating layer 4 can be a spacer layer with the thickness of 50~5000 Å.

In FIG. 3, said first insulating layer 2 is formed on said silicon substrate 1, and said first conductive layer 3 is formed on part area 21 of said first insulating layer 2, the left and right sidewalls 31, 32 of said first conductive layer 3 are covered by said second insulating layer 4. Said third insulating layer 5 is formed on said first conductive layer 3, said second insulating layer 4 and other part area 22 of said first insulating layer 2. Said second conductive layer 6 is formed on said third insulating layer 5. Said first conductive layer 3 is used as a floating gate. By the blocking function of said second and third insulating layer 4, 5, said second conductive layer 6 is isolated with said first conductive layer 3 and served as a control gate.

The difference between the conventional split gate flash memory unit shown in FIG. 1 and that shown in FIG. 3 is that a second insulating layer 4 is further formed on oxide layers 31, 32 at left and right sidewalls of said first conductive layer 3, so as to reduce considerably the leaking phenomenon on left and right lower edges of said first conductive layer 3.

In order to further disclose the preferred process of the present invention in forming the structure of FIG. 3 and the reason to reduce the leaking phenomenon, it is now described by the manufacturing process of the preferred embodiment shown in FIGS. 4(a)~4(d) as below.

Figure 4A:
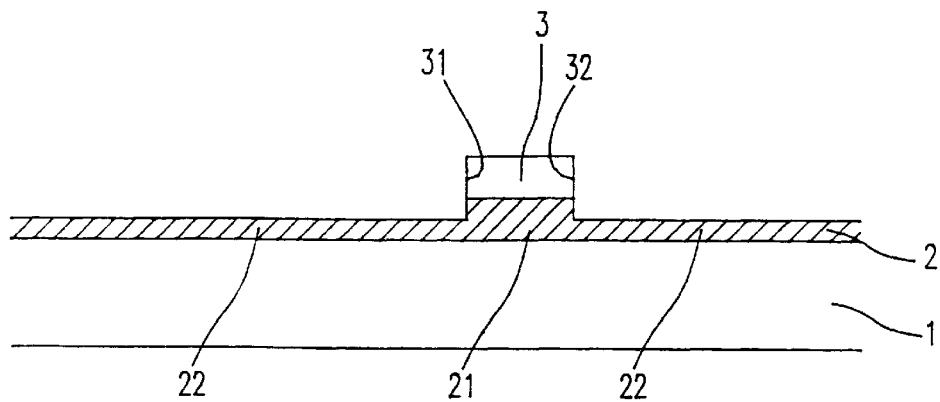

There comprises the following steps in FIG. 4(a):

forming said first insulating layer 2 on said silicon substrate 1 by a thermal oxidation or chemical vapor deposition (CVD) process; wherein said first insulating layer 2 is a gate oxide layer with the thickness of at least 60 Å, or a tunnelling oxide layer with the thickness of 60~120 Å;

forming said first conductive layer 3 on said first insulating layer 2 by a chemical vapor deposition process;

forming a photoresist layer on said first conductive layer 3; and etching part of said first conductive layer to expose left and right sidewalls 31, 32 of said first conductive layer 3 and other part area 22 of said first insulating layer 2 by photolithography and etching techniques; said etching process can be done by a dry etching process.

Figure 4B:
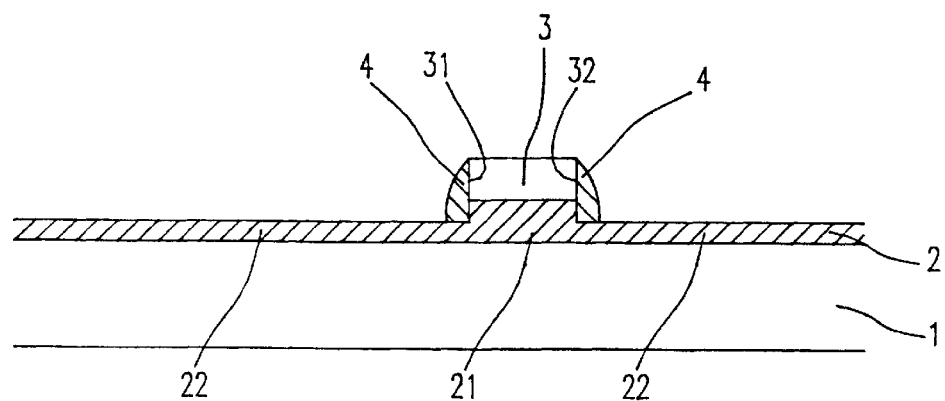
Figure 4C:
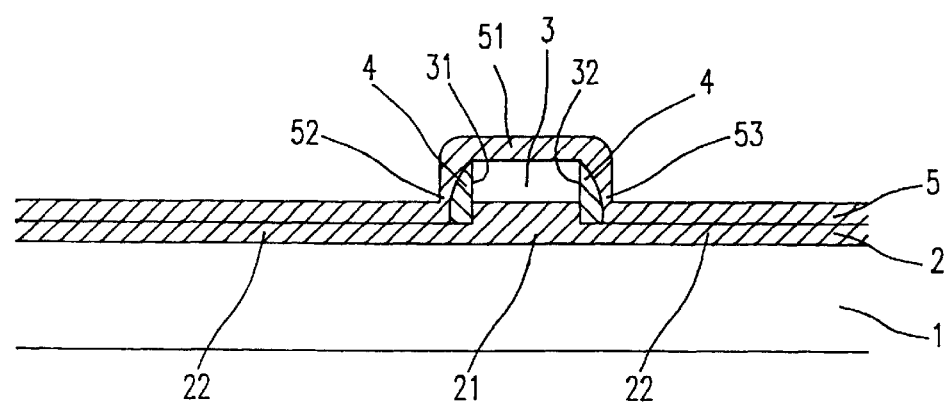
Figure 4D:
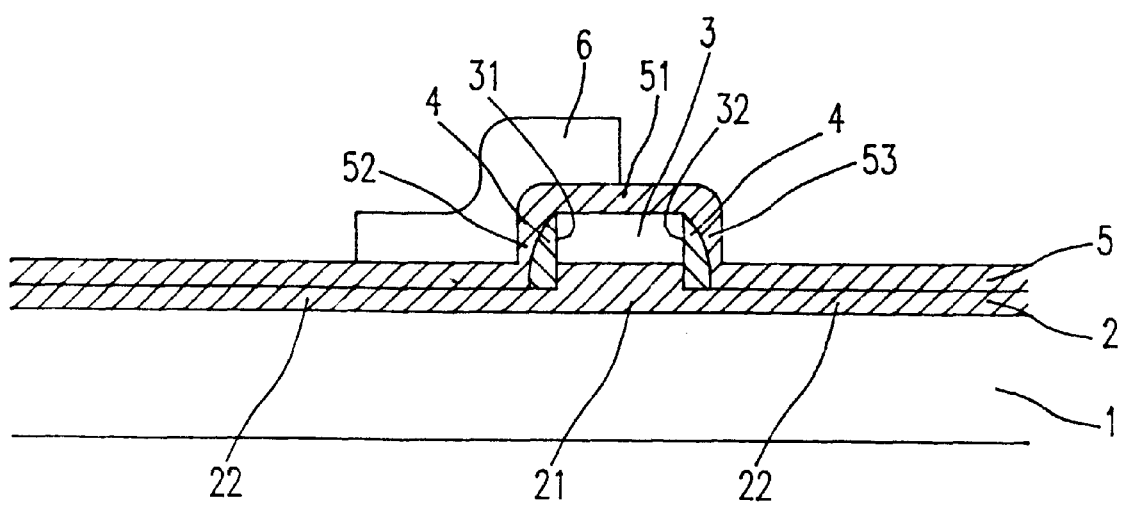

There comprises the following steps in FIG. 4(b):

forming a dielectric layer on said first conductive layer 3, its left and right sidewalls 31, 32 and other part area 22 of said first insulating layer 2 by a chemical vapor deposition process;

removing part of said dielectric layer by an anisotropic etching process to expose the top surface of said first conductive layer 3 and other part area 22 of said first insulating layer 2, and a second insulating layer 4 with thickness of 50~5000 Å is formed on left and right sidewalls 31, 32 of said first conductive layer 3;

There comprises the following steps in FIG. 4(c):

performing a thermal oxidation process to form said third insulating layer 5 on said first conductive layer 3, said second insulating layer 4 and other part area 22 of said first insulating layer 2, wherein said second insulating layer 4 can provide an isolation effect at the left and right lower edges of said first conductive layer 3;

Said third insulating layer 5 can be a tunnelling oxide layer with thickness of 60~120 Å, or a gate oxide layer with thickness of at least 60 Å;

There comprises the following steps in FIG. 4(d):

forming said second conductive layer 6 on said third insulating layer 5 by a chemical vapor deposition process;

forming a photoresist layer on said second conductive layer 6; and etching part of said second conductive layer by photolithography and etching techniques to form a split gate flash memory unit with the leaking phenomenon being reduced.

Summing up the above, a spacer layer is formed on left and right sidewalls 31, 32 of said first conductive layer 3 before performing a thermal oxidation process, the leaking phenomenon is apparently avoided and the charge retention property of a split gate flash memory unit is enhanced, therefore the present invention is indeed of having industrial applicability.

The present invention can be modified by any skillful person in the art without departing the spirit and scope of the accompanying claims.

What is claimed is:

1. A process for manufacturing a split gate flash memory unit, comprising the steps of:
   (a) providing a silicon substrate having a first insulating layer, and forming a first conductive layer on said first insulating layer;
   (b) removing part of the first conductive layer to expose left and right sidewalls of said first conductive layer on said first insulating layer by the steps of:
      (b1) forming a photoresist layer on said first conductive layer; and
      (b2) etching part of said first conductive layer by photolithography and etching techniques to expose left and right sidewalls of said first conductive layer as well as part of said first insulating layer;
   (c) executing a chemical vapor deposition (CVD) process to form a second insulating layer on left and right sidewalls of said first conductive layer;
   (d) performing thermal oxidation process to form a third insulting layer on said first conductive layer, said second insulating layer, and another part area of said first conductive layer, said second insulating layer, and another part area of said first insulating layer, wherein by an isolation effect provided by said second insulating layer reduces a leaking phenomenon at left and right lower edges of said first conductive layer is reduced; and
   (e) forming a second conductive layer on said third insulating layer to form said split gage flash memory unit.

2. The process according to claim 1, wherein said step (a) includes the steps of:
   (a1) forming an oxide layer on said silicon substrate; and
   (a2) forming a first conductive layer on said oxide layer.

3. The process according to claim 2, wherein said oxide layer in said step (a1) is a gate oxide layer having a thickness of at least 60 Å, and said gate oxide layer is formed by a thermal oxidation process.

4. The process according to claim 2, wherein said oxide layer in said step (a1) is a tunnelling oxide layer having a thickness ranged from 60 Å to 120 Å, said tunnelling oxide layer is formed by one of a chemical vapor deposition (CVD) process and a thermal oxidation process.

5. The process according to claim 2, wherein said first conductive layer in said step (a2) is one of a polysilicon layer and a polycide layer, and is formed by a chemical vapor deposition (CVD) process.

6. The process according to claim 1, wherein said part of said first conductive layer in step (b) is removed by a dry etching process.

7. The process according to claim 1, wherein said step (c) includes step of:
   (c1) forming a dielectric layer on said first conductive layer and its left and right sidewalls as well as said part area of said first insulating layer by a chemical vapor deposition (CVD) process: and
   (c2) removing part of the dielectric layer to expose a top surface of said first conductive layer and said other part area of the first insulating layer, so that a second insulating layer is formed on left and right sidewalls of said first conductive layer.

8. The process according to claim 7, wherein in said step (c2) said other part of said dielectric layer is removed by an anisotropic etching process.

9. The process according to claim 7, wherein said second insulating layer in said step (c2) has a thickness ranged from 50 Å to 5000 Å.

10. The process according to claim 1, wherein said third insulating layer in step (d) is a tunnelling oxide layer having a thickness ranged from 60 Å to 120 Å.

11. The process according to claim 1, wherein said third insulating layer in said step (d) is a gate oxide layer having a thickness of at least 60 Å.

12. The process according to claim 1, wherein said step (e) includes the steps of:
   (e1) forming said second conductive layer on said third insulating layer;
   (e2) forming a photoresist layer on said second conductive layer; and
   (e3) etching part of said second conductive layer by photolithography and etching techniques to form said split gate flash memory unit.

13. The process according to claim 1, wherein said second conductive layer in said step (e) is one of a polysilicon layer and a polycide layer, and is formed by a chemical vapor deposition process.

* * * * *